United States Patent
Wang et al.

(10) Patent No.: US 6,658,376 B1
(45) Date of Patent: *Dec. 2, 2003

(54) DETERMINATION OF VIBRATION FREQUENCY CHARACTERISTICS OF ELECTRODED CRYSTAL PLATE

(75) Inventors: Ji Wang, Milpitas, CA (US); Jiun-Der Yu, Mountain View, CA (US); Yook-Kong Yong, Princeton, NJ (US); Tsutomu Imai, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/451,381

(22) Filed: Nov. 30, 1999

Related U.S. Application Data (63) Continuation-in-part of application No. 09/333,721, filed on Jun. 15, 1999.

(51) Int. Cl.[7] .......................... G06F 17/50; G06G 7/62; G06G 7/48
(52) U.S. Cl. .............................. 703/13; 703/2; 703/4; 703/6; 703/7; 703/14
(58) Field of Search ............................ 703/2, 4, 6–7, 703/13–14

(56) References Cited

U.S. PATENT DOCUMENTS

| | | |
|---|---|---|
| 4,039,969 A | 8/1977 | Martin |
| 4,071,786 A | 1/1978 | Yamashita |
| 4,114,062 A | 9/1978 | Mattuschka |
| 4,167,686 A | 9/1979 | Fukuyo |
| 4,188,557 A | 2/1980 | Mattuschka |
| 4,262,227 A | 4/1981 | Ikeno et al. |
| 4,281,298 A | 7/1981 | Gounji et al. |
| 4,306,170 A | 12/1981 | Motte et al. |
| 4,333,842 A | 6/1982 | Ito et al. |
| 4,388,548 A | 6/1983 | Vangheluwe |
| 4,511,202 A | 4/1985 | Kasai |
| 4,716,332 A | 12/1987 | Hayashi |
| 4,894,577 A | 1/1990 | Okamoto et al. |
| 5,112,642 A * | 5/1992 | Wajid .......................... 427/10 |
| 5,283,496 A | 2/1994 | Hayashi et al. |
| 5,548,178 A | 8/1996 | Eda et al. |
| 5,675,208 A | 10/1997 | Huang et al. |
| 6,230,113 B1 * | 5/2001 | Wang et al. .................... 703/1 |

OTHER PUBLICATIONS

Yong et al., "Accuracy of crystal plate theories for high–frequency vibrations in the range of the fundamental thickness shear mode"; IEEE Trans. Ultrasonics, Ferroelectrics and frequency control; pp. 888–892; Sep. 1996.*

Yong et al., "On the acurracy of plate theories for the prediction of unwanted modes near the fundamental thickness shear mode."; Proc. Frequency Control Symp.; pp. 755–760; Jun. 1995.*

Lee et al.; "A two–dimensional theory for high–frequency vibrations of piezoelectric crystal plates with or without electrodes"; J, Appl. Phys.; 61 (4); pp. 1249–1262; 1987.*

Yong et al.; "Numerical algorithms and results for SC–cut Quartz plates vibrating at the third harmonic overtone of thickness shear"; IEEE Trans. Ultrasonics, Ferroelectrics and Freq. Control; pp. 685–693; 1994.*

Midlin; "High frequency vibrations of piezoelectric crystal plates"; Int. J. Solids Structures; pp. 895–906; 1972.*

(List continued on next page.)

Primary Examiner—Hugh Jones
(74) Attorney, Agent, or Firm—Michael T. Gabrik (57) ABSTRACT

An apparatus and method for determining certain correction factors in analyzing the vibration frequency characteristics of an electroded crystal plate. The developed correction factors are introduced to correct the inaccuracies of third-order thickness-shear cut-off frequencies. The analysis is preferably carried out during the design of a piezoelectric device incorporating the electroded crystal plate before production of the device.

28 Claims, 4 Drawing Sheets

OTHER PUBLICATIONS

Yong et al.; "Frequency–temperature effects in three–dimensional surface acoustic wave periodic structures"; IEEE Proc. Int. Freq. Control Symp.; pp. 915–921; Apr. 1999.*

Yu; "Second–order analysis of free vibrations of piezoelectric ceramic actuators"; IEEE Freq. Control Symp.; pp. 695–702; May 1998.*

Lee et al.; "A new 2–D theory for vibrations of piezoelectric crystal plates with electrode faces"; IEEE Ultrasonics Symp.; pp. 1591–1594; Nov. 1996.*

Wang, J. et al. "A New Theory for Electroded Piezoelectric Plates and its Finite Element Application for the Forces Vibrations Analysis of Quartz Crystal Resonators" IEEE Proceedings of Ultrasonics Symposium. vol. 1, Oct. 5–8, 1998, pp. 913–918.

Yong, Y. K. et al. "A Set of Hierarchical Finite Elements for Quartz Plate Resonators" IEEE Proc. of Ultrasonics Symposium. vol. 2, Nov. 3–6, 1996, pp. 981–985.

Wang, J. et al. "The Piezoelectrically Forced Vibrations of AT–cut Quartz Strip Resonators" $50^{th}$ Proc. of the 1996 International Frequency Control Symposium Jun. 5–7, 1996, pp. 390–397.

Yong, Y.K. "Third–Order Mindlin Plate Theory Predictions for the Frequency–Temperature Behavior of Straight Crested Wave Modes in AT–and SC–Cut Quartz Plates" $50^{th}$ Proc of the 1996 IEEE Int'l Frequency Control Symposium. Jun. 5–7, 1996, pp. 648–656.

Zhang, Z. et al. "Numerical Analysis of Thickness Shear Thin Film Piezoelectric Resonators Using a Laminated Plate Theory." Trans. on Ultrasonics, Ferroelectrics and Frequency Control, vol. 42, No. 4, Jul. 1995, pp. 734–746.

Yong, Y. et al. "A Perturbation for Finite Element Modeling of Piezoelectric Vibrations in Quartz Plate Resonators," Trans. on Ultrasonics, Ferroelectrics and Frequency Control, vol. 40, No. 5, Sep. 1993, pp. 551–562.

Brissaud, M. "Characterization of Piezoceramics, " Trans. on Ultrasonics, Ferroelectrics and Frequency Control, vol. 38, No. 6, Nov. 1991, pp. 603–617.

Lerch, R. "Finite Element Analysis of Piezoelectric Transducers," IEEE Proc. of Ultrasonics Symposium, vol. 2, Oct. 1988, pp. 643–654.

Wang, J. et al. "Finite Element Analysis of the Piezoelectric Vibrations of Plate Resonators with Higher–Order Plate Theory," Proc. of 1997 IEEE Int'l Frequency Control Symposium, May 1997, pp. 650–658.

* cited by examiner

DETERMINATION OF VIBRATION FREQUENCY CHARACTERISTICS OF ELECTRODED CRYSTAL PLATE

CROSS REFERENCE TO RELATED APPLICATIONS

This application is a continuation-in-part of application Ser. No. 09/333,721, entitled "Correction Factors for the Analysis of Piezoelectric Devices", filed Jun. 15, 1999, the contents of which are incorporated herein by reference.

FIELD OF THE INVENTION

The present invention relates to a system and method for determining the vibration frequency of an electroded crystal plate, preferably carried out during the design of a piezoelectric device incorporating the electroded crystal plate and before production thereof. This invention also relates to a piezoelectric device that has been designed in accordance with the method of the invention. The invention further relates to a program of instructions for carrying out the design-based method of the invention.

BACKGROUND OF THE INVENTION

A wide variety of piezoelectric devices are used in various electronic applications. One common type of piezoelectric device is a crystal resonator. A typical crystal resonator includes a layer of crystalline piezoelectric material having opposite faces, each having a corresponding electrode bonded thereto to sandwich the piezoelectric material between the electrodes. The crystal resonator vibrates in response to an electrical stimulus applied to the electrodes. The vibration induces a highly stable electrical oscillation across the electrodes that is useful for timing other devices.

For a piezoelectric device to operate properly, it is important for its vibration frequency and displacement characteristics to fall within design specifications. For example, if these characteristics fall outside design specifications, the piezoelectric device may not have the desired oscillation frequency or magnitude response. Unfortunately, it has proven very difficult to precisely determine such elastic properties of piezoelectric devices. One reason for this difficulty is that there is considerable interplay between the various elastic properties of a piezoelectric material. This difficulty is compounded when other components of the device, such as the electrodes, are also considered.

Due to such difficulties, piezoelectric devices generally are formed in a rough state that is not guaranteed to be within final design specifications. The piezoelectric devices may then be brought into final design specifications by adding or removing material from the piezoelectric device. In one conventional approach, material is added or removed from electrodes. In another conventional approach, stiffening electrical fields are applied to a piezoelectric device during operation. In a third conventional approach, a piezoelectric device is stiffened to reduce acceleration sensitivity by adding one or more braces either on the electrodes or on the layer of piezoelectric material.

Such conventional approaches to providing piezoelectric devices with desired elastic properties have several drawbacks. They are not truly design based, but rather require extra fabrication steps, such as adding or removing material from electrodes, or special operating environments, such as appropriate stiffening electrical fields. Generation of stiffening electrical fields may require additional circuitry. Conventional approaches typically also require the formation of various prototype devices to determine how to fabricate the piezoelectric device with a suitable rough state as described above. Furthermore, conventional approaches are believed to work poorly where electrode thickness exceeds about two percent of total device thickness.

Patent application Ser. No. 09/212,816, entitled "Stiffness Effects in Piezoelectric Devices," filed Dec. 16, 1998, provides a design-based system and method for verifying designs of a piezoelectric device during the design process and before any manufacturing steps are carried out. In particular, the system and method verifies whether the electrodes have the appropriate stiffness characteristics. With this arrangement, extra fabrication steps and generation of special operating environments are not necessary. The application also provides an improved piezoelectric device that meets final design specifications while reducing the need for post-production processing of the device.

Patent application Ser. No. 09/333,721, entitled "Correction Factors for the Analysis of Piezoelectric Devices," filed Jun. 15, 1999, provides a system and method for determining and applying correction factors in the analysis of the vibration frequency and displacement characteristics of the piezoelectric material itself. This analysis is also carried out during the design and before production of the piezoelectric device.

SUMMARY OF THE INVENTION

It is an object of the present invention to provide further improvements to the design-based system and method for analyzing piezoelectric devices.

It is another object of this invention to provide a system and method for determining the vibration frequency and displacement characteristics of the piezoelectric crystal material and the attached electrodes, considered as a single unit, during the design of a piezoelectric device incorporating these components and before production thereof.

It is a further object of this invention to provide a piezoelectric device that has been designed in accordance with the method of the invention.

In one aspect, the invention involves a method for verifying a design of an electroded crystal plate, preferably made of AT-cut crystal. The method comprises forming a model, including one or more correction factors, of the electroded crystal plate, and analyzing the model to determine one or more vibration frequency characteristics of the electroded crystal plate to determine whether it meets a design specification. The vibration frequency characteristics determined may include the fundamental thickness-shear frequency, coupling characteristics between the thickness-shear vibration mode and at least one other vibration mode such as the flexural mode, or coupling characteristics between the thickness-stretch vibration mode and at least one other vibration mode such as the flexural mode.

The one or more correction factors are developed by forming a stress-strain model of the electroded crystal plate, forming a motion model of the electroded crystal plate based on the formulated stress-strain model, and forming a frequency model of the electroded crystal plate based on the formulated stress-strain model and the motion models.

Another aspect of the invention involves an apparatus, such as a computer system, for verifying the design of an electroded crystal plate or a piezoelectric device incorporating such a plate. The apparatus comprises the appropriate hardware or software for carrying out the above-described method.

In another aspect, the invention involves a processor-readable medium embodying a program of instructions, e.g., software, for execution by the processor for performing the design verification method described above.

DETAILED DESCRIPTION OF THE INVENTION

The present invention provides a system and method for developing correction factors and applying these correction factors in a design-based analysis of vibration frequency characteristics of a piezoelectric material and the attached electrodes, e.g., an electroded crystal plate, to be used in piezoelectric devices before such devices are manufactured. The present invention also provides improved piezoelectric devices whose vibration frequency characteristics have been determined during the design stage, thereby reducing post-production processing requirements of the devices relative to conventional piezoelectric devices.

Figure 1:
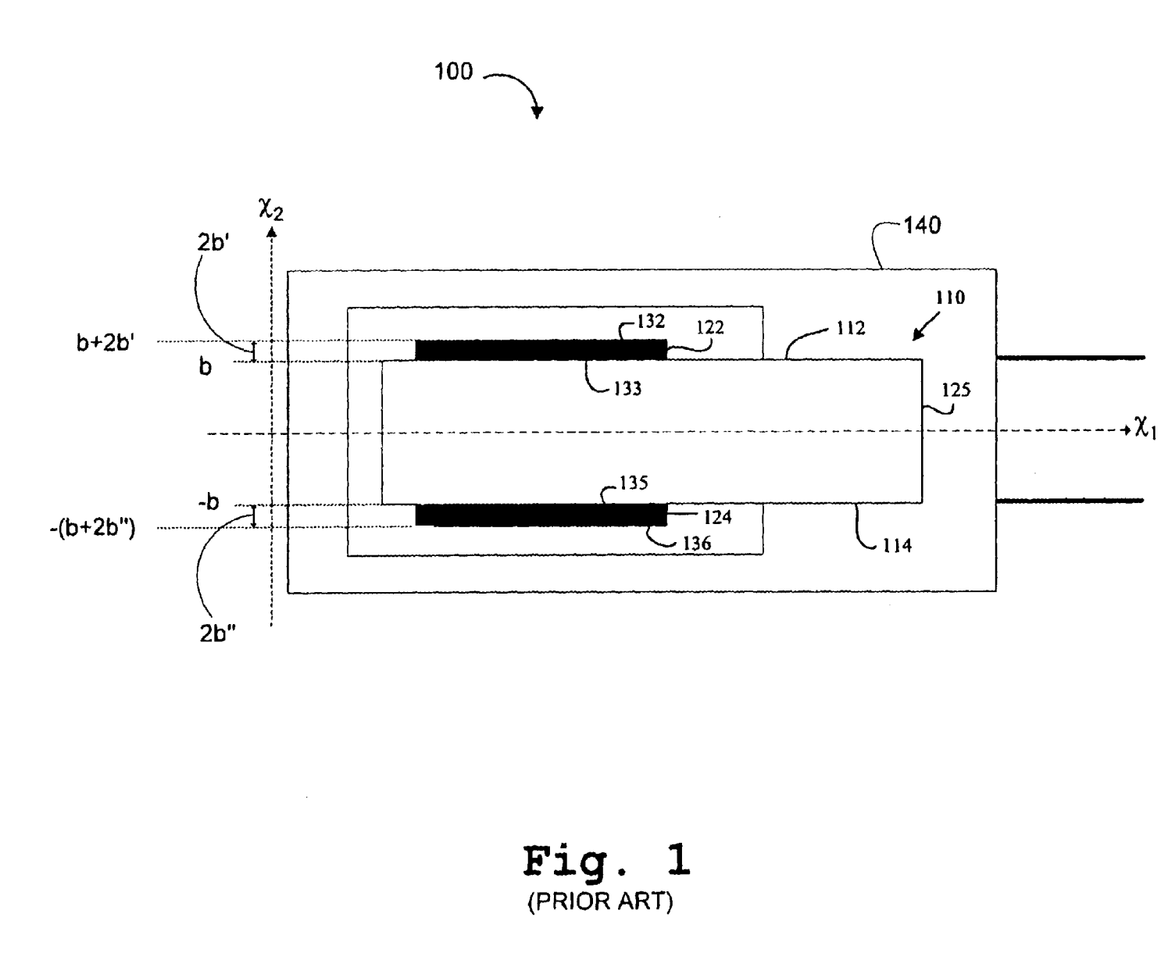
FIG. 1 is a cross-sectional view of a piezoelectric device having two electrodes affixed to opposite faces of a layer of crystal material.

Referring to FIG. 1, a cross-sectional view of a piezo-electric device 100 is shown relative to an $x_1$, $x_2$, $x_3$ coordinate system where the $x_3$ dimension extends perpendicular to the drawing sheet. Piezoelectric device 100 includes a layer of crystal piezoelectric material 110 affixed to a pair of electrodes 122 and 124. More particularly, the layer of crystal material 110 has a plate configuration defined by top and bottom faces 112 and 114 respectively and an outer edge 125. Electrode 122 has top and bottom faces 132 and 133 respectively, and electrode 124 likewise has top and bottom faces 135 and 136 respectively. Bottom face 133 of electrode 122 is affixed to top face 112 of crystal plate 110, and top face 135 of electrode 124 is affixed to bottom face 114 of crystal plate 110. Electrodes 122 and 124 may be formed in conventional manner, such as by deposition of thin layers of conductive material on top and bottom faces 112 and 114 of crystal plate 110. For protective purposes, piezoelectric device 100 generally is mounted in a sealing case 140. This may be achieved, for example, by bonding or welding the layer of crystal material 110 to sealing case 140.

As illustrated in FIG. 1, crystal plate 110 has a thickness in the $x_2$ direction of $2b$, while electrodes 122, 124 have thicknesses $2b'$ and $2b''$ respectively. The analysis described herein assumes that the electrodes have the same thickness, that is, that $b'=b''$.

In operation, electrodes 122 and 124 and crystal plate 110 vibrate in unison in response to an electrical potential applied across the electrodes. The vibration induces an electrical oscillation across the electrodes. The electrical oscillation is highly stable and may beneficially be used, for example, as a frequency generator, or for timing or clocking other devices. In accordance with the present invention, the design of the crystal plate together with the electrodes is carried out and verified to assure that the device will operate properly, preferably before production.

Figure 2:
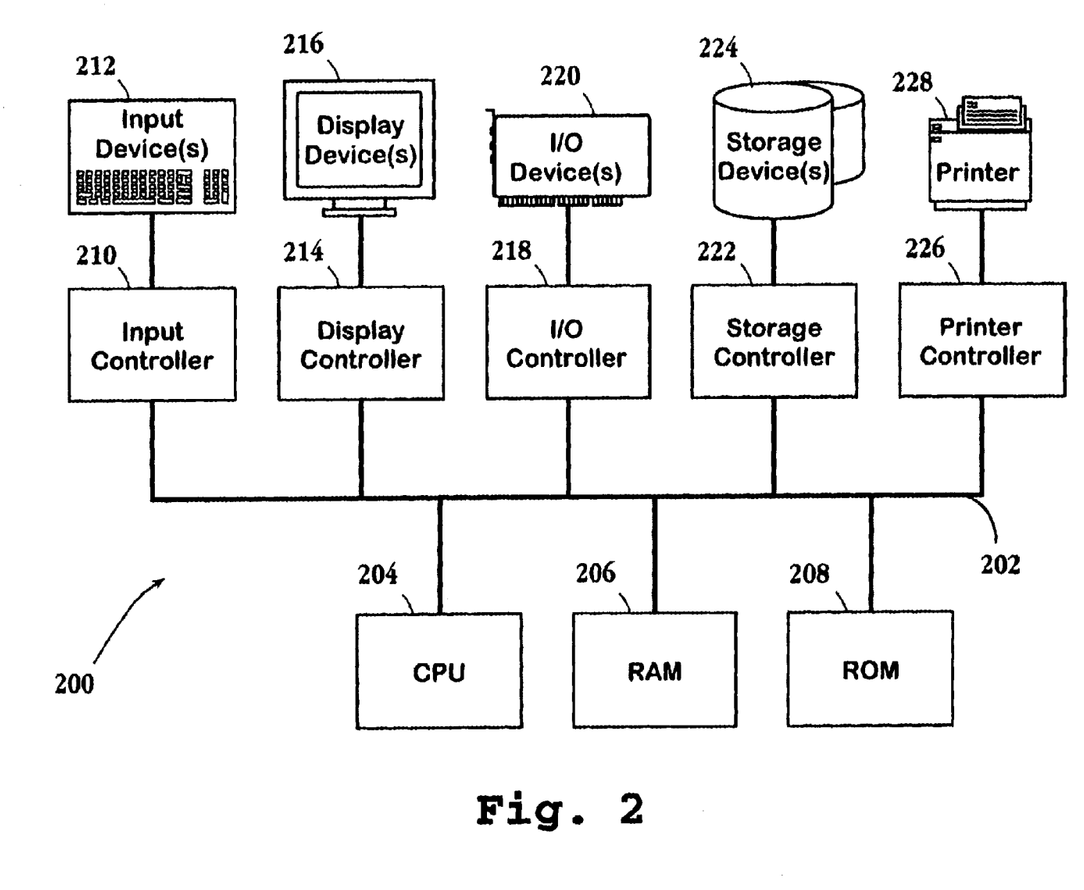
FIG. 2 is a functional block diagram of a computer system for carrying out various aspects of the method for verifying certain design characteristics of an electroded crystal plate or piezoelectric device incorporating such a plate, according to the present invention.

FIG. 2 is a functional block diagram of a computer system 200 suitable for carrying out the design-based analysis of the present invention, including the vibration frequency analysis of the electroded crystal plate. FIG. 2 is exemplary only; other suitable computer systems may also be used.

Computer system 200 includes a multi-bit bus 202, a central processing unit (CPU) 204, and system memory. CPU 204 represents processing circuitry such as a microprocessor that provides computing resources and preferably includes a floating-point math coprocessor to increase performance speed on various calculations performed in accordance with the method of the present invention. The system memory is capable of being read by CPU 204 and may be in the form of dynamic or static random-access memory (RAM) 206 and read-only memory (ROM) 208.

Multi-bit bus 202 interconnects the CPU and system memory with various device interfaces or controllers. Input controller 210 represents interface circuitry that connects to one or more input devices 212 such as a keyboard, mouse, stylus, etc. for supplying information to CPU 204. Display controller 214 represents interface circuitry that connects to one or more display devices 216 such as a monitor or video display terminal. I/O controller 218 represents interface circuitry that connects to one or more I/O devices 220 such as a modem, or other network connection. Storage controller 222 represents interface circuitry that connects to one or more storage devices 224 such as a magnetic disk or tape drive, optical disk drive or solid-state storage device. Printer controller 226 represents interface circuitry that connects to one or more printers 228 such as a laser or ink-jet printer.

In a preferred embodiment, a program of instructions (e.g., software) directs CPU 204 to perform the vibration frequency analysis method based on user input in accordance with the present invention. The software for this task may be fetched by CPU 204 from RAM 206 for execution. The software may be stored in ROM 208 and transferred to RAM 206 when in use. Alternatively, the software may be transferred to RAM 206, or directly to CPU 204 for execution, from ROM 208 or storage device 224 or through I/O device 220. More broadly, the software may be conveyed by any medium that is readable by CPU 204. Such media may include, for example, various magnetic media such as disks or tapes, various optical media such as compact disks, network paths such as broadband or baseband transmission paths, as well as other communication paths throughout the electromagnetic spectrum including carrier waves 209 encoded to transmit the software. Thus, the term "processor-readable medium" as used herein is intended to cover all such media to transmit the program of instructions.

As an alternative to software implementation, analysis and design aspects of the invention may be implemented with functionally equivalent hardware using discrete components, application specific integrated circuits (ASICs), digital signal processing circuits, or the like. Such hardware may be physically integrated with the computer processor(s) or may be a separate element which may be embodied on a computer card that can be inserted into an available card slot in the computer.

Thus, the computer-based aspects of the invention can be implemented using software, hardware, or combination thereof. The diagrams, equations and accompanying description provide the functional information one skilled in the art would require to implement a system to perform the functions required.

In operation, a user inputs the relevant parameters of crystal plate 110 and electrodes 122, 124 under consideration into computer system 200 via input device 212. In response to such input from the user, computer system 200 executes the program of instructions to perform vibration frequency analysis of the electroded crystal plate in accordance with the present invention.

The manner in which the analysis is performed, and in particular the manner in which the correction factors are developed and applied to a model of the electroded crystal plate, such as a vibration frequency model, to determine certain important characteristics of the electroded crystal plate will now be described.

I. Introduction

As previously noted, the correction factors of the present invention have been developed and determined using certain modeling equations. These modeling equations are developed in accordance with the Mindlin plate theory. This theory is based upon the power series expansion of displacement and has been extensively applied in the high frequency vibration analysis of crystal plates of resonators.

Earlier analytical efforts concentrated on truncated equations, usually with only the coupling of the thickness and flexural modes, for infinite strips. These simpler equations and models have been useful in obtaining solutions which are important in the design and analysis of piezoelectric devices.

More recently, the finite element method (FEM) has been applied for a more accurate analysis of crystal plates. These implementations enable not only rigorous study of the two-dimensional problem but also in-depth examination of the third-or even higher-order plate theory which is typically required for precise frequency and mode shape computations. For example, devices vibrating in higher-order overtones of the fundamental thickness-shear frequency may require such higher-order plate theory for analysis. It has been found that the third-order plate theory gives an accurate prediction of the coupled thickness-shear and flexural vibration frequencies. However, higher-order theory has not been thoroughly studied in the past due to the difficulties in obtaining closed form solutions even for straight-crested waves for plates of very simple configurations. As a result, the accuracy with which these theories are able to determine the elastic characteristics of a piezoelectric material, even dispersion characteristics and cut-off frequencies, has not previously been examined in sufficient detail to confidently apply the theories to vibrational problems.

Although traditional solution techniques for frequency vibration problems have been demonstrated by Mindlin throughout his work, the inventors herein have found that some changes in the form of correction factors are required to improve the accuracy of the solutions and hence the analysis of the electroded crystal plates. For the first-order Mindlin plate theory, the correction is essential. For the third- and higher-order plate theory, the correction improves the accuracy of the thickness-shear vibration solutions, although some of the third-order solutions are nearly exact even without the correction. Moreover, the inventors herein have found that for crystal plates with aspect ratios much greater than one the accuracy of the solutions in both the frequency and displacement analysis are significantly improved with the introduction of correction factors. The aspect ratio of a piezoelectric crystal plate is its length, width or diameter divided by its thickness which in the illustrated embodiment is the length or diameter of piezoelectric crystal plate 110 measured in the $x_1$ direction divided by $2b$.

The inventors' development of these correction factors in accordance with the Mindlin plate theory is demonstrated below. Their development begins with a study of the cut-off frequencies of the straight-crested waves and a comparison to the exact solutions. Next, the inventors' demonstrate their developed method for correcting the third-order plate theory to make the cut-off frequencies exact. As demonstrated below, correction factors for different strains of the same order have different values when the mass and stiffness of the electrodes are considered together with the crystal plate. Although these correction factors have particular application in analyzing vibration frequency characteristics in a piezoelectric plate, they may also be used for other plate vibration problems.

II. Fundamentals of the Mindlin Higher-Order Plate Theory

A compact version of the higher-order plate theory which focuses on the electrode effect and the correction aspects of the theory is discussed below. As previously noted, the basic equations of higher order Mindlin plate theory are based upon the power series expansion of displacements in the thickness coordinate $x_2$ as shown in equation (1) which is set forth in the Appendix along with the other numbered equations referenced in the following discussion. The configuration of piezoelectric plate 110 is shown in FIG. 1. The strain tensor, based on the theory of three-dimensional elasticity, is set forth in equation (2) with the $n^{th}$-order strain components defined in equation (3).

The constitutive relations for a crystal plate 110 of uniform thickness are defined from the weighted integration across the thickness of the plate 110 since the variational equations of motion are defined that way. The two-dimensional $n^{th}$-order stress-strain relations are given by equation (4). Note that the higher-order strains are coupled through the integration constants $B_{mn}$ as shown in equation (5).

The two-dimensional stress equations of motion are set forth in equation (6), where $\rho$ is the density of the piezoelectric plate 110. It should be noted that the tractions on the two faces 112 and 114 have been incorporated into the equations of motion through $F_j^{(n)}$. The inertia terms are also coupled through the integration constants $B_{mn}$.

With the displacement, strain, and stress given in equations (1), (3), and (4), the two-dimensional kinetic and strain energy densities through the integration across the thickness of the uniform plate 110 are set forth in equation (7). Again, the higher-order displacements and strains are coupled through the integration constants $B_{mn}$.

A. Boundary Conditions

With the prescribed traction or displacement denoted by barred variables and the edge of the crystal denoted by "C", the boundary conditions related to the higher-order plate theory are described in equations (8), (9) and (10).

B. Effect of Electrode Platings

Consider identical electrode platings on upper surface 122 and lower surface 124 of the crystal plate. To accommodate the extra inertia from the electrodes, the right hand side of the stress equations of motion is modified as set forth in (11), where the electrode mass ratio R and the modified $n_{th}$-order surface tractions $F_j^{(n)}$ are defined in (12) and (13). The stress effect of the electrodes can be incorporated into the higher-order plate theory by changing the constitutive relations as given by equation (14) in which the redefined elastic stiffness is shown in (15). Note that the comma in the subscript of the stiffness does not denote a partial derivative.

III. Cut-Off Frequencies of the Third-Order Plate Theory

Examination of the higher-order Mindlin plate theory begins with the two-dimensional equations identified in the previous section. The tensor equations are combined and expanded to obtain the field equations in displacements. These field equations, with necessary truncations, are then used to study the dispersion characteristics of an infinite plate, that is, a piezoelectric plate infinite in the $x_1$ and $X_3$ directions, as was previously done by Mindlin. The accuracy of the dispersion relation in comparison with the solution of the three-dimensional elasticity equations ultimately determines whether correction procedures are needed. The examination of the dispersion relation includes checking the cut-off frequency and comparing the slope and curvature of the dispersion curve. However, only after the cut-off frequency is correctly obtained can the dispersion curve be corrected to yield solutions close to the exact solutions in a given frequency range.

The strain components from equation (3) in the abbreviated notation are set forth in equation (16). Note that the strain components are grouped by odd and even indices, and that the higher-order displacements are associated with the strain components with even indices. These higher-order displacement components are discarded during the truncation. It will be seen later that it is due to these terms that the stress is corrected through the strain. The constitutive equations in (14) can be rewritten in the abbreviated notation as set forth in equation (17). With the strain components in equation (16), the constitutive equations in terms of the displacement components are given in equation (18). Similarly, the stress equations of motion for traction-free plates that have $F_j^{(n)}=0$ are set forth in equation (19). Substituting the stress components (18) into equation (19) results in the two-dimensional displacement equations of motion of the $n_{th}$-order.

As is known, the dispersion characteristics of the first-order equations, i.e., equations including only $u_j^{(n)}$ (j=12,3;n=0,1), have been thoroughly examined and discussed by Mindlin. These studies paved the way for the derivation and correction of plate theories for the thickness-shear vibrations of piezoelectric plates. However, they are limited to plates without electrodes or plates with thin electrodes.

Starting where Mindlin left off, the inventors previously extended the analysis to higher-order plate theory, particularly the third-order theory, and previously developed correction procedures for plates without electrodes. This work is the subject of the pending application cross-referenced above. Now in this invention, the inventors have further extended the correction procedure for the third-order plate theory, which considers the inertia and stiffness effects of the electrodes.

Starting with straight-crested waves in the $x_1$ direction, the stress-displacement equation for one spatial variable can be further reduced as shown in equation (20). Similarly, the stress equations of motion for straight-crested waves in the $x_1$ direction are as set forth in equation (21).

For further study of vibrations with higher-order modes, equations (21) are expanded up to the third-order terms as stated in equations (22). From equations (22) it is seen that, depending on the material symmetry, the thickness-shear modes $u_1^{(k)}$,k=1,2,3, thickness-stretch modes $u_2^{(k)}$,k=1,2,3, width-shear modes $u_3^{(k)}$,k=1,2,3, and other non-thickness modes can be coupled or separated.

The description herein is primarily directed to an AT-cut quartz crystal, a popular material for crystal resonators and sensors. The AT-cut quartz crystal has the following elastic constants, measured in $10^9$ N/m$^2$:

$c_{11}$=86.74, $c_{22}$=129.77, $c_{33}$=102.83, $c_{12}$=−8.25, $c_{13}$=27.15, $c_{14}$=−3.66, $c_{23}$=−7.42, $c_{24}$=5.7, $c_{34}$=9.92, $c_{44}$=38.61, $c_{55}$=68.81, $c_{66}$=29.01, $c_{56}$=2.53, and the density $\rho$=2649 Kg/m$^3$.

The stress components related to the thickness-shear vibration in the $x_1$ direction are provided in equation (23).

Inserting equation (23) into the equations of motion (22) and disregarding the derivative with respect to $x_1$ yields equation (24). Now, with the displacements defined as per equation (25) and the dimensionless frequency $\Omega$ as provided in equation (26), the equation in (24) can be written as set forth in equation (27). The vanishing of the coefficient matrix in (27) gives the frequency equation as set forth in (28).

We see that (28) is an algebraic equation whose roots depend on the mass ratio and the stiffness ratio. Here we consider the electrodes as copper. The material constants are $$c'_{22}=17.223\times 10^{10} N/m^2, \; c'_{44}=c'_{66}=4.37\times 10^{10} N/m^2, \; \rho'=10500 \; Kg/m^3.$$

Given various mass ratios, it is quite easy to solve equation (28) for its two roots, which are the fundamental thickness-shear frequency and the overtone. Three results are listed in (29). As can be observed later, those first roots in (29) are very close to the fundamental thickness-shear vibration frequencies obtained from the three-dimensional equations. In fact, the difference is less than 0.06%. This confirms the finding by Yong et al. that the third-order Mindlin plate theory is accurate for the fundamental thickness-shear frequency. The second roots are quite different from the exact frequencies.

Following similar procedures for the coupled thickness-stretch and width-shear modes, that is, for $u_j^{(n)}$(j=2,3;n=1,3), equation (30) is obtained, where $A_2^{(n)}$ and $A_3^{(n)}$ are the $n^{th}$-order displacement amplitudes in the $x_2$ and $X_3$ directions respectively. The vanishing of the determinant of the coefficient matrix in (30) gives the algebraic frequency equation. The four roots of the frequency equation at various mass ratios are listed in (31). The first root is predominantly a width-shear mode while the second root is basically a thickness-stretch mode. As will be seen later, the second root is pretty close to the exact solution but the first root is not as good. The third and fourth roots of (30) are quite far from the exact values.

IV. Exact Cut-Off Frequency of Plated AT-cut Crystals

To obtain the exact thickness-shear, thickness-stretch, and width-shear frequencies for an electroded crystal plate of infinite extent, we start from the three-dimensional elasticity equations. For thin electrodes, an approximate solution was obtained and studied by Bleustein and Tiersten. The exact solutions obtained in this invention are not limited to plates with thin electrodes.

Consider an infinite crystal plate with identical electrodes. The crystal is either a monoclinic material with $x_1$ being the diagonal axis or a rotated Y-cut quartz. The electrode material is assumed to be isotropic. For thickness vibrations, i.e., vibrations dependent only on the thickness coordinate $x_2$, the three-dimensional constitutive equations and stress equations of motion reduce to as set forth in (32) and (33). It can be seen that the thickness-shear mode ($u_1$, $T_5$, $T_6$) is not coupled with the thickness-stretch and width-shear modes ($u_2$, $u_3$, $T_j$, j=1,2,3,4).

For the thickness-shear mode, we assume the displacement is as set forth in (34), in which the primed variables refer to the electrodes and the upper (lower) sign is for the upper (lower) electrode. Note that the continuity of displacement $u_1$ at $x_2$=±b is automatically satisfied by the form. The corresponding shear stress is obtained by substituting (34)

into (32) and is given in (35). To satisfy the equation of motion (33), the wave numbers $\eta$ and $\eta'$ should be related to the frequency as set forth in (36).

The continuity of the shear stress $T_6$ at $x_2=\pm b$ gives the relation (37) and the stress-free condition at $x_2=\pm(b+2b')$ requires relation (38). The combination of (37) and (38) gives the frequency equation as set forth in (39). It is easily seen that the solutions of (39), i.e., the exact cut-off frequencies, depend on $c_{66}, c'_{66}, \rho, \rho', b, b'$. However the cut-off frequencies from the plate theory, as obtained from equations (28) and (30), depend only on the stiffness ratio and the mass ratio R. For copper electrodes, the fundamental thickness-shear frequency and the first overtone for various thickness ratios (hence various mass ratio R) are listed in (40).

For the coupled thickness-stretch and width-shear vibrations, we assume the displacements in the crystal plate, i.e. $u_2, u_3$, are of the form (41). In order to satisfy the equations of motion (33), the wave numbers $\eta_1, \eta_2$ and the amplitude ratios $\alpha_1, \alpha_2$ should be as set forth in (42) and (43). The corresponding stress components are obtained by substituting (41) into (32) and are given in (44). Displacement fields of the electrodes and the corresponding stress components are set forth in (45) to (47). Note that the displacements in (45) satisfy not only the equations of motion but also the continuity of displacements at $x_2=\pm b$. The frequency equation is obtained by satisfying the continuity of stresses ($T_2$ and $T_4$) at $x_2=\pm b$ and the traction-free condition at $x_2=\pm(b+2b')$, and is given in (48). The first four roots of the frequency equation at various thickness ratios are computed for copper-plated AT-cut quartz and are listed in (49).

Comparison of (31) and (49) shows that the second root, i.e., the frequency of the predominant thickness-stretch mode, from the third-order plate theory is quite close to the exact value. However the difference is about one to two percent, which is much higher than the difference for the thickness-shear mode. The discrepancy in the first root is over five percent.

V. Correction Factors

Correction of the first-order plate theory, with or without electrodes, had been studied and explained by Mindlin. The essence of the concept is to correct the inaccuracy of the cut-off frequencies and thereby obtain the exact cut-off frequencies of infinite plates when the wave number approaches zero. The same idea was extended by the inventors for the third- and higher-order theory for plates without electrodes. It was found that, for corrections not considering the electrode, the correction factors of the same order are identical, i.e., $\kappa_2^{(n)} = \kappa_4^{(n)} = \kappa_6^{(n)}$.

As was pointed out by the inventors in the related application referenced above, there are two choices of putting the correction factors in the constitutive relations. The most intuitive way is associating $(\kappa_q^{(n)})^2$ with $S_q^{(n)}, q=2,4,6$. However, such arrangement would finally result in an asymmetric stiffness matrix for the finite element analysis, which usually causes problems in solving the eigenvalues. The better option is using $\kappa_p^{(n)}$ to correct the $n^{th}$-order stress components $T_p^{(n)}$ and, at the same time, associating $\kappa_q^{(m)}$ with the strain components. According to this rule, the modified constitutive equations are set forth in (50).

For the third-order plate theory, correction factors for the zero-, first-, and second-order stresses and strains are needed. There are nine factors total. However, the first-order correction factors $\kappa_p^{(l)}, p=2,4,6$ are related to higher modes of the thickness vibrations, which have little effect on the behavior of the plate equations around the wanted fundamental thickness-shear mode. Hence, they are just set to one. Only six factors remain to be determined.

For the correction of the thickness-shear mode, the stress components $T_6^{(0)}$ and $T_6^{(2)}$ are expanded up to the third-order terms and are written as set forth in equation (51). The resulting frequency equation with correction factors is set forth in equation (52). The correction factors should be chosen such that the frequency equation (52) yields the exact cut-off frequency and its first overtone at the given mass ratio R. Hence, given a mass ratio R, we compute the first two roots of the exact frequency equation (39) and then substitute the roots into (52) to solve for the corresponding factors $\kappa_6^{(0)}$ and $\kappa_6^{(2)}$. The results are shown in (53).

For the coupled thickness vibrations in the $x_2$ and $x_3$ directions, the symmetric correction factors $\alpha=\kappa_2^{(0)}$, $\beta=\kappa_4^{(0)}$, $\gamma=\kappa_2^{(2)}$ and $\delta=\kappa_4^{(2)}$ change the constitutive equations to those in equation (54). Substitution of equation (54) into (22) gives the algebraic equation (55). The vanishing of the determinant of the coefficient matrix of amplitudes $A_2^{(1)}, A_3^{(1)}, A_2^{(3)}, A_3^{(3)}$ gives the frequency equation. Since we require the frequency equation to yield the exact fundamental thickness-stretch and width-shear frequencies and the next overtones, we substitute the first four roots of (48) into the corrected frequency equation and solve for the correction factors for various mass ratios. The values are listed in (56).

Comparison of (53) and (56) shows that, although the correction factors of the same order are identical for R=0, generally the factors of the same order are different. The discrepancy is caused by the electrodes and grows with the mass ratio.

Figure 3:
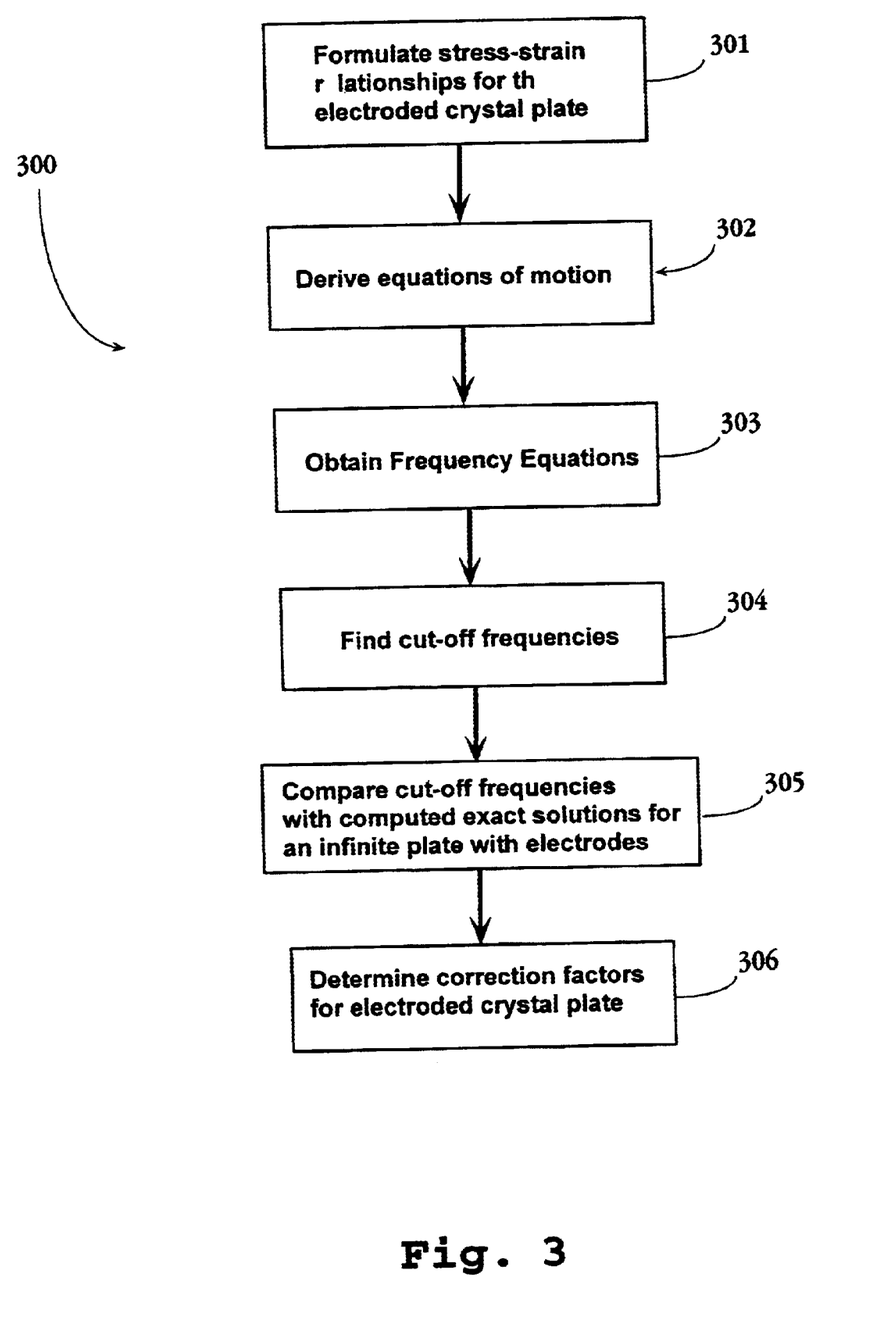
FIG. 3 is a flowchart illustrating a method for developing correction factors to be used in the analysis and design of an electroded crystal plate or piezoelectric device incorporating such a plate, according to embodiments of the present invention.

The development of the correction factors described in detail above is summarized in the flow chart of FIG. 3 which depicts a method 300 for developing such correction factors according to embodiments of the invention. In step 301, stress-strain relationships are formulated for the electroded crystal plate, that is, crystal plate 110 and electrodes 122, 124. From the stress-strain relationships, equations of motion are derived in step 302. Based on the relationships and equations obtained in steps 301 and 302, frequency equations are developed in step 303. Using these frequency equations, certain cut-off frequencies are determined in step 304. These solutions are then compared with the computed exact solutions for an infinite plate with electrodes in step 305. Based on the comparison, the correction factors are determined for the electroded crystal plate in step 306.

VI. Design-Based Application

Figure 4:
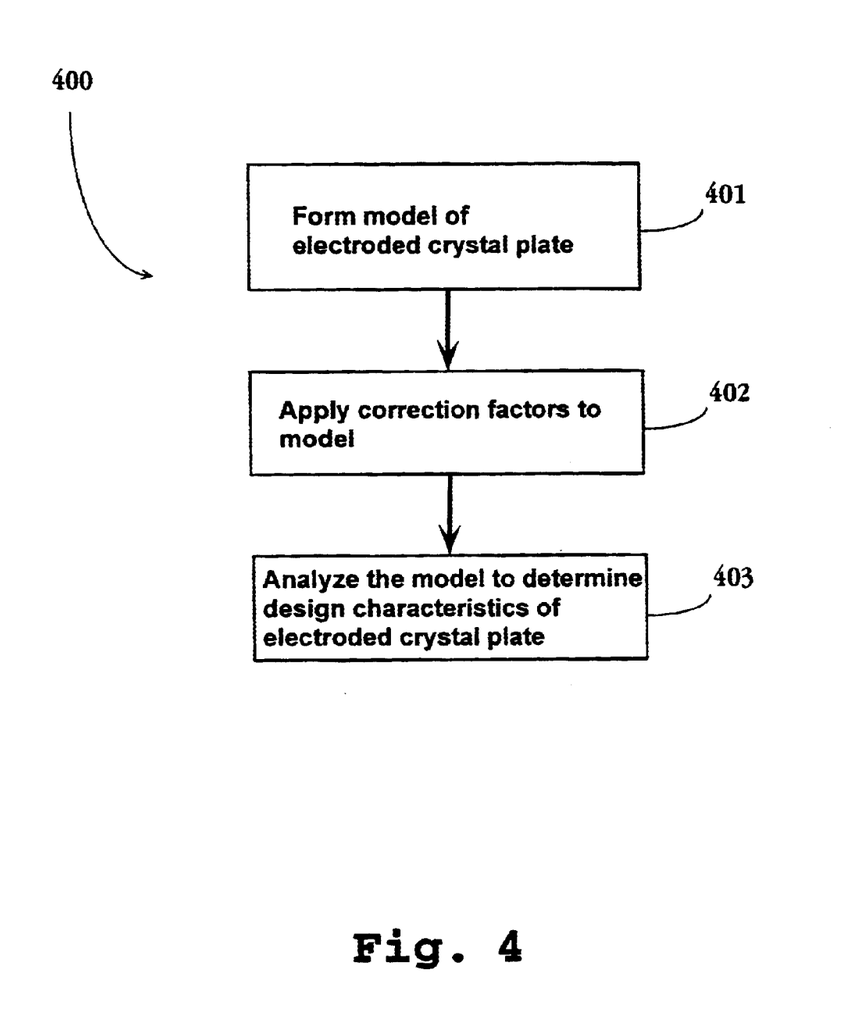
FIG. 4 is a flowchart illustrating a method for forming and analyzing a model of an electroded crystal plate to verify its design or the design of a piezoelectric device incorporating such a plate, according to embodiments of the present invention.

In accordance with the invention, the developed correction factors may be advantageously used in the design of piezoelectric device 100. FIG. 4 is a flow chart illustrating a method 400 of applying the correction factors to analyze or verify the design of device 100. In step 401, a model of crystal plate 110 with electrodes 122, 124 is formed. This model is preferably a vibration frequency model of the electroded crystal plate. In step 402, correction factors are applied to the model. The model is then analyzed in step 403 to determine certain important characteristics of the electroded crystal plate such as its vibration frequency characteristics. For example, the model may be analyzed to determine the fundamental thickness-shear frequency characteristics of the plate 110 with electrodes 122, 124, or to determine the coupling of its thickness-shear vibration mode or thickness-stretch vibration mode with other vibration modes such as the flexural vibration mode. Such analysis may further include verifying whether the electroded crystal plate—and hence device 100—meets a design specification for the device.

The designed-based analysis of an electroded piezoelectric crystal plate in accordance with the present invention significantly reduces post-production processing of the crystal plate and electrodes, as well as the piezoelectric device in which the electroded crystal plate is to be embodied. The design-based analysis is particularly well suited to be implemented on a computer system, such as the one shown in FIG. 2.

While the invention has been described in conjunction with various embodiments, it will be evident to those skilled in the art in light of the foregoing description that many further alternatives, modifications and variations are possible. Thus, the invention described herein is intended to embrace all such alternatives, modifications, and variations as may fall within the spirit and scope of the appended claims.

$$u_j(x_1, x_2, x_3) = \sum_{n=0} u_j^{(n)}(x_1, x_3, t) x_2^n, \quad j = 1, 2, 3, \tag{1}$$

where $u_j$, $u_j^{(n)}$, and t are the displacement components, two-dimensional nth-order displacement components, and time.

$$S_{ij} = \sum_n S_{ij}^{(n)} x_2^n, \quad i, j = 1, 2, 3, \tag{2}$$

with the nth-order strain components defined as $$S_{ij}^{(n)} = \frac{1}{2}[u_{i,j}^{(n)} + u_{j,i}^{(n)} + (n+1)(\delta_{i2} u_j^{(n+1)} + \delta_{j2} u_i^{(n+1)})]. \tag{3}$$

$$T_{ij}^{(n)} = \int_{-b}^{b} T_{ij} x_2^n \, dx_2 = \sum_m B_{mn} c_{ijkl} S_{kl}^{(m)}, \tag{4}$$

where $T_{ij}$ are the three-dimensional stress tensor, $T_{ij}^{(n)}$ the two-dimensional nth-order stress components and $c_{ijkl}$ the elastic constants of material.

$$B_{mn} = \begin{cases} \dfrac{2b^{m+n+1}}{m+n+1}, & m+n = \text{even}, \\ 0, & m+n = \text{odd}. \end{cases} \tag{5}$$

$$T_{ij,i}^{(n)} - n T_{2j}^{(n-1)} + F_j^{(n)} = \rho \sum_m B_{mn} \ddot{u}_j^{(m)}, \tag{6}$$

$$F_j^{(n)} = b^n [T_{2j}(b) - (-1)^n T_{2j}(-b)],$$

$$\overline{K} = \frac{1}{2} \rho \sum_m \sum_n B_{mn} \dot{u}_j^{(m)} \dot{u}_j^{(n)}, \tag{7}$$

$$\overline{H} = \frac{1}{2} \sum_m \sum_n B_{mn} c_{ijkl} S_{ij}^{(m)} S_{kl}^{(n)}.$$

$$T_{2j} = \bar{t}_j \text{ on } A(x_2 = \pm b), \tag{8}$$

$$n_i T_{ij}^{(n)} = \bar{t}_j^{(n)} \text{ on } C,$$

where $n_i$ is the unit normal to the edge C and $$\bar{t}_j^{(n)} = \int_{-b}^{b} \bar{t}_j x_2^n \, dx_2, \tag{9}$$

or alternatively $$u_i = \bar{u}_i \text{ on } A(x_2 = \pm b) \tag{10}$$

$$u_j^{(n)} = \bar{u}_j^{(n)} \text{ on } C.$$

$$T_{ij,i}^{(n)} - n T_{2j}^{(n-1)} + \mathcal{F}_j^{(n)} = \rho \sum_m B_{mn}[1 + (m+n+1)R] \ddot{u}_j^{(m)}. \tag{11}$$

$$R = 2 \frac{\rho'}{\rho} \frac{b'}{b}. \tag{12}$$

$$\mathcal{F}_j^{(n)} = b^n [T'_{2j}(b + 2b') - (-1)^n T'_{2j}(-b - 2b')]. \tag{13}$$

$$T_{ij}^{(n)} = \sum_m B_{mn} \tilde{c}_{ijkl,mn} S_{kl}^{(m)}. \tag{14}$$

$$\tilde{c}_{ijkl,mn} = c_{ijkl}\left[1 + 2(m+n+1)\frac{c'_{ijkl}}{c_{ijkl}} \frac{b'}{b}\right]. \tag{15}$$

$$S_1^{(n)} = u_{1,1}^{(n)}, \quad S_3^{(n)} = u_{3,3}^{(n)}, \quad S_5^{(n)} = u_{3,1}^{(n)} + u_{1,3}^{(n)}, \tag{16}$$

$$S_2^{(n)} = (n+1) u_2^{(n+1)}, \quad S_4^{(n)} = u_{2,3}^{(n)} + (n+1) u_3^{(n+1)},$$

$$S_6^{(n)} = u_{2,1}^{(n)} + (n+1) u_1^{(n+1)}.$$

$$T_p^{(n)} = \frac{\partial \overline{H}}{\partial S_p^{(n)}} = \sum_{m=0} B_{mn} \tilde{c}_{pq,mn} S_q^{(m)}, \quad p, q = 1, 2, 3, 4, 5, 6. \tag{17}$$

$$T_p^{(n)} = \sum_{m=0}^{N} B_{mn} \{ \tilde{c}_{p1,mn} u_{1,1}^{(m)} + \tilde{c}_{p2,mn}(m+1) u_2^{(m+1)} + \tilde{c}_{p3,mn} u_{3,3}^{(m)} + \tilde{c}_{p4,mn}[u_{2,3}^{(m)} + (m+1) u_3^{(m+1)}] + \tilde{c}_{p5,mn}(u_{1,3}^{(m)} + u_{3,1}^{(m)}) + \tilde{c}_{p6,mn}[u_{2,1}^{(m)} + (m+1) u_1^{(m+1)}] \}. \tag{18}$$

$$\begin{Bmatrix} T_{1,1}^{(n)} \\ T_{6,1}^{(n)} \\ T_{5,1}^{(n)} \end{Bmatrix} + \begin{Bmatrix} T_{5,3}^{(n)} \\ T_{4,3}^{(n)} \\ T_{3,3}^{(n)} \end{Bmatrix} - n \begin{Bmatrix} T_6^{(n-1)} \\ T_2^{(n-1)} \\ T_4^{(n-1)} \end{Bmatrix} = \rho \sum_{m=0} B_{mn}[1 + (m+n+1)R] \begin{Bmatrix} \ddot{u}_1^{(m)} \\ \ddot{u}_2^{(m)} \\ \ddot{u}_3^{(m)} \end{Bmatrix}. \tag{19}$$

$$T_p^{(n)} = \sum_{m=0}^{N} B_{mn} \{ \tilde{c}_{p1,mn} u_{1,1}^{(m)} + \tilde{c}_{p2,mn}(m+1) u_2^{(m+1)} + \tilde{c}_{p4,mn}(m+1) u_3^{(m+1)} + \tilde{c}_{p5,mn} u_{3,1}^{(m)} + \tilde{c}_{p6,mn}[u_{2,1}^{(m)} + (m+1) u_1^{(m+1)}] \}. \tag{20}$$

$$\begin{Bmatrix} T_{1,1}^{(n)} \\ T_{6,1}^{(n)} \\ T_{5,1}^{(n)} \end{Bmatrix} - n \begin{Bmatrix} T_6^{(n-1)} \\ T_2^{(n-1)} \\ T_4^{(n-1)} \end{Bmatrix} = \rho \sum_{m=0} B_{mn}[1 + (m+n+1)R] \begin{Bmatrix} \ddot{u}_1^{(m)} \\ \ddot{u}_2^{(m)} \\ \ddot{u}_3^{(m)} \end{Bmatrix}. \tag{21}$$

$$\begin{Bmatrix} T_{1,1}^{(0)} \\ T_{6,1}^{(0)} \\ T_{5,1}^{(0)} \end{Bmatrix} = 2b\rho(1+R) \begin{Bmatrix} \ddot{u}_1^{(0)} \\ \ddot{u}_2^{(0)} \\ \ddot{u}_3^{(0)} \end{Bmatrix} + \frac{2b^3}{3} \rho(1+3R) \begin{Bmatrix} \ddot{u}_1^{(2)} \\ \ddot{u}_2^{(2)} \\ \ddot{u}_3^{(2)} \end{Bmatrix}, \tag{22}$$

$$\begin{Bmatrix} T_{1,1}^{(1)} \\ T_{6,1}^{(1)} \\ T_{5,1}^{(1)} \end{Bmatrix} - \begin{Bmatrix} T_6^{(0)} \\ T_2^{(0)} \\ T_4^{(0)} \end{Bmatrix} = \frac{2b^3}{3} \rho(1+3R) \begin{Bmatrix} \ddot{u}_1^{(1)} \\ \ddot{u}_2^{(1)} \\ \ddot{u}_3^{(1)} \end{Bmatrix} + \frac{2b^5}{5} \rho(1+5R) \begin{Bmatrix} \ddot{u}_1^{(3)} \\ \ddot{u}_2^{(3)} \\ \ddot{u}_3^{(3)} \end{Bmatrix},$$

$$\left\{\begin{matrix}T_{1,1}^{(2)}\\T_{6,1}^{(2)}\\T_{5,1}^{(2)}\end{matrix}\right\} - 2\left\{\begin{matrix}T_6^{(1)}\\T_2^{(1)}\\T_4^{(1)}\end{matrix}\right\} = \frac{2b^3}{3}\rho(1+3R)\left\{\begin{matrix}\ddot{u}_1^{(0)}\\\ddot{u}_2^{(0)}\\\ddot{u}_3^{(0)}\end{matrix}\right\} + \frac{2b^5}{5}\rho(1+5R)\left\{\begin{matrix}\ddot{u}_1^{(2)}\\\ddot{u}_2^{(2)}\\\ddot{u}_3^{(2)}\end{matrix}\right\},$$

$$\left\{\begin{matrix}T_{1,1}^{(3)}\\T_{6,1}^{(3)}\\T_{5,1}^{(3)}\end{matrix}\right\} - 3\left\{\begin{matrix}T_6^{(2)}\\T_2^{(2)}\\T_4^{(2)}\end{matrix}\right\} = \frac{2b^5}{5}\rho(1+5R)\left\{\begin{matrix}\ddot{u}_1^{(1)}\\\ddot{u}_2^{(1)}\\\ddot{u}_3^{(1)}\end{matrix}\right\} + \frac{2b^7}{7}\rho(1+7R)\left\{\begin{matrix}\ddot{u}_1^{(3)}\\\ddot{u}_2^{(3)}\\\ddot{u}_3^{(3)}\end{matrix}\right\}.$$

$$T_6^{(0)} = 2b\tilde{c}_{66,00}u_1^{(1)} + 2b^3\tilde{c}_{66,20}u_1^{(3)},\quad (23)$$
$$T_6^{(2)} = \frac{2b^3}{3}\tilde{c}_{66,02}u_1^{(1)} + \frac{6b^5}{5}\tilde{c}_{66,22}u_1^{(3)}.$$

$$-\tilde{c}_{66,00}u_1^{(1)} - b^2\tilde{c}_{66,20}u_1^{(3)} = \frac{b^2}{3}\rho(1+3R)\ddot{u}_1^{(1)} + \frac{b^4}{5}\rho(1+5R)\ddot{u}_1^{(3)},\quad (24)$$
$$-\tilde{c}_{66,02}u_1^{(1)} - \frac{9b^2}{5}\tilde{c}_{66,22}u_1^{(3)} = \frac{b^2}{5}\rho(1+5R)\ddot{u}_1^{(1)} + \frac{b^4}{7}\rho(1+7R)\ddot{u}_1^{(3)}.$$

$$u_1^{(n)} = b^n A_1^{(n)}e^{i\omega t},\quad n = 0, 1, 2, 3.\quad (25)$$

$$\omega^2\rho = \frac{c_{66}}{b^2}\Omega^2.\quad (26)$$

$$\hat{c}_{42,00}A_2^{(1)} + \left(\hat{c}_{44,00} - \frac{\Omega^2}{3}R_3\right)A_3^{(1)} + \hat{c}_{42,02}A_2^{(3)} +$$
$$\left(\hat{c}_{44,02} - \frac{\Omega^2}{5}R_5\right)A_3^{(3)} = 0,$$

$$\left(\hat{c}_{22,20} - \frac{\Omega^2}{5}R_5\right)A_2^{(1)} + \hat{c}_{24,20}A_3^{(1)} +$$
$$\left(\frac{9}{5}\hat{c}_{22,22} - \frac{\Omega^2}{7}R_7\right)A_2^{(3)} + \frac{9}{5}\hat{c}_{22,22}A_3^{(3)} = 0,$$

$$\hat{c}_{42,20}A_2^{(1)} + \left(\hat{c}_{44,20} - \frac{\Omega^2}{5}R_5\right)A_3^{(1)} + \frac{9}{5}\hat{c}_{42,22}A_2^{(3)} +$$
$$\left(\frac{9}{5}\hat{c}_{44,22} - \frac{\Omega^2}{7}R_7\right)A_3^{(3)} = 0,$$

$$\hat{c}_{pq,mn} = \frac{\tilde{c}_{pq,mn}}{c_{66}},\quad p,q = 2,4,\quad R_j = 1 + jR,\quad j = 1,3,5,7.$$

| $b'/b$ | Mass ratio $R$ | 1st root | 2nd root | 3rd root | 4th root | (31) |
|---|---|---|---|---|---|---|
| 0.000 | 0.0000000000 | 1.699708912 | 3.387828636 | 6.154567486 | 14.45490058 | |
| 0.001 | 0.0079275198 | 1.688865089 | 3.360034927 | 6.022347106 | 14.11826861 | |
| 0.010 | 0.0792751982 | 1.592574252 | 3.128665598 | 5.382179897 | 12.40080070 | |

$$\left[\frac{\tilde{c}_{66,00}}{c_{66}} - \frac{\Omega^2}{3}(1+3R)\right]A_1^{(1)} + \left[\frac{\tilde{c}_{66,20}}{c_{66}} - \frac{\Omega^2}{5}(1+5R)\right]A_1^{(3)} = 0,\quad (27)$$
$$\left[\frac{\tilde{c}_{66,02}}{c_{66}} - \frac{\Omega^2}{5}(1+5R)\right]A_1^{(1)} + \left[\frac{9}{5}\frac{\tilde{c}_{66,22}}{c_{66}} - \frac{\Omega^2}{7}(1+7R)\right]A_1^{(3)} = 0.$$

$$\left[\frac{\tilde{c}_{66,00}}{c_{66}} - \frac{\Omega^2}{3}(1+3R)\right]\left[\frac{9}{5}\frac{\tilde{c}_{66,22}}{c_{66}} - \frac{\Omega^2}{7}(1+7R)\right] = \left[\frac{\tilde{c}_{66,02}}{c_{66}} - \frac{\Omega^2}{5}(1+5R)\right]^2.\quad (28)$$

| $b'/b$ | Mass ratio $R$ | 1st root | 2nd root | (29) |
|---|---|---|---|---|
| 0.000 | 0.0000000000 | 1.571233393 | 2.468774376 | |
| 0.001 | 0.0079275198 | 1.558853619 | 2.430024605 | |
| 0.010 | 0.0792751982 | 1.456309923 | 2.120838591 | |

$$\left(\hat{c}_{22,00} - \frac{\Omega^2}{3}R_3\right)A_2^{(1)} + \hat{c}_{24,00}A_3^{(1)} +$$
$$\left(\hat{c}_{22,02} - \frac{\Omega^2}{5}R_5\right)A_2^{(3)} + \hat{c}_{24,02}A_3^{(3)} = 0,\quad (30)$$

$$T_1 = c_{12}u_{2,2} + c_{14}u_{3,2},\quad (32)$$
$$T_2 = c_{22}u_{2,2} + c_{24}u_{3,2},$$
$$T_3 = c_{32}u_{2,2} + c_{34}u_{3,2},$$
$$T_4 = c_{42}u_{2,2} + c_{44}u_{3,2},$$
$$T_5 = c_{56}u_{1,2},$$
$$T_6 = c_{66}u_{1,2}.$$

$$T_{6,2} = \rho\ddot{u}_1,\quad (33)$$
$$T_{2,2} = \rho\ddot{u}_2,$$
$$T_{4,2} = \rho\ddot{u}_3.$$

$$u_1 = A\sin\eta x_2 e^{i\omega t},\quad\text{in crystal plate},\quad (34)$$
$$u_1' = (\pm A\sin\eta b\cos\eta'(x_2 \mp b) + B'\sin\eta'(x_2 \mp b))e^{i\omega t},$$
in electrodes.

$$T_6 = c_{66}A\eta\cos\eta x_2 e^{i\omega t},\quad (35)$$
$$T_6' = c_{66}'\eta'[\mp A\sin\eta b\sin\eta'(x_2 - b) + B'\cos\eta'(x_2 - b)]e^{i\omega t}.$$

$$\eta^2 c_{66} = \omega^2\rho,\quad (36)$$
$$\eta'^2 c_{66}' = \omega^2\rho'.$$

$$c_{66}\eta\cos\eta bA = c_{66}'\eta'B'.\quad (37)$$

$$-\sin\eta b\sin 2\eta'b'A + \cos 2\eta'b'B' = 0.\quad (38)$$

-continued $$\begin{vmatrix} c_{66}\eta\cos\eta b & -c'_{66}\eta' \\ -\sin\eta b \sin 2\eta' b' & \cos 2\eta' b' \end{vmatrix} = 0, \quad (39)$$

(40)

| $b'/b$ | Mass ratio $R$ | 1st root | 2nd root |
|--------|----------------|----------|----------|
| 0.000 | 0.00000000 | 1.57079633 | 4.71238898 |
| 0.001 | 0.00792752 | 1.55844227 | 4.67533925 |
| 0.010 | 0.07927520 | 1.45581028 | 4.37635022 |

$$u_2 = A_2 \sin\eta_1 x_2 + B_2 \sin\eta_2 x_2 \quad (41)$$
$$u_2 = \alpha_1 A_2 \sin\eta_1 x_2 + \alpha_2 B_2 \sin\eta_2 x_2$$

$$\eta_j^2 = \frac{c_{22} + c_{44} \pm \sqrt{(c_{22} - c_{44})^2 + 4c_{24}^2}}{2(c_{22}c_{44} - c_{24}^2)} \rho\omega^2, \quad \begin{cases} + \text{ for } j=1 \\ - \text{ for } j=2 \end{cases} \quad (42)$$

$$\alpha_j = -\frac{c_{22}\eta_j^2 - \rho\omega^2}{c_{24}\eta_j^2}, \quad j=1,2. \quad (43)$$

$$T_2 = (c_{22} + \alpha_1 c_{24})A_2\eta_1\cos\eta_1 x_2 + (c_{22} + \alpha_2 c_{24})B_2\eta_2\cos\eta_2 x_2 \quad (44)$$
$$T_4 = (c_{24} + \alpha_1 c_{44})A_2\eta_1\cos\eta_1 x_2 + (c_{24} + \alpha_2 c_{44})B_2\eta_2\cos\eta_2 x_2$$

$$u'_2 = \pm(A_2\sin\eta_1 b + B_2\sin\eta_2 b)\cos\eta'_1(x_2 \mp b) + \quad (45)$$
$$\qquad B'_2\sin\eta'_1(x_2 \mp b)$$
$$u'_3 = \pm(A_2\alpha_1\sin\eta_1 b + B_2\alpha_2\sin\eta_2 b)\cos\eta'_2(x_2 \mp b) +$$
$$\qquad B'_3\sin\eta'_2(x_2 \mp b)$$

$$\eta'^2_1 = \frac{\rho'\omega^2}{c'_{22}} \quad \eta'^2_2 = \frac{\rho'\omega^2}{c'_{44}} \quad (46)$$

$$T'_2 = c'_{22}[\mp(A_2\sin\eta_1 b + B_2\sin\eta_2 b)\eta'_1\sin\eta'_1(x_2 \mp b) + \quad (47)$$
$$\qquad B'_2\eta'_1\cos\eta'_1(x_2 \mp b)]$$
$$T'_4 = c'_{44}[\mp(A_2\alpha_1\sin\eta_1 b + B_2\alpha_2\sin\eta_2 b)\eta'_2\sin\eta'_2(x_2 \mp b) +$$
$$\qquad B'_2\eta'_2\cos\eta'_2(x_2 \mp b)]$$

$$\begin{vmatrix} (c_{22}+\alpha_1 c_{24})\eta_1 - & (c_{22}+\alpha_2 c_{24})\eta_2 - \\ c'_{22}\eta'_1\tan\eta_1 b\tan 2\eta'_1 b' & c'_{22}\eta'_1\tan\eta_2 b\tan 2\eta'_1 b' \\ (c_{24}+\alpha_1 c_{44})\eta_1 - & (c_{24}+\alpha_2 c_{44})\eta_2 - \\ c'_{44}\alpha_1\eta'_2\tan\eta_1 b\tan 2\eta'_2 b' & c'_{44}\alpha_2\eta'_2\tan\eta_2 b\tan 2\eta'_2 b' \end{vmatrix} = 0 \quad (48)$$

$$T_p^{(n)} = \sum_{m=0}^{n} B_{mn} c_{pq} \kappa_p^{(n)} \kappa_q^{(m)} S_q^{(m)}, \quad \kappa_1^{(n)} = \kappa_3^{(n)} = \kappa_5^{(n)} = 1. \quad (50)$$

$$T_6^{(0)} = 2b\tilde{c}_{66,00}(\kappa_6^{(0)})^2 u_1^{(1)} + 2b^3 \tilde{c}_{66,20}\kappa_6^{(0)}\kappa_6^{(2)} u_1^{(3)}, \quad (51)$$
$$T_6^{(2)} = \frac{2b^3}{3}\tilde{c}_{66,02}\kappa_6^{(0)}\kappa_6^{(2)} u_1^{(1)} + \frac{6b^5}{5}\tilde{c}_{66,22}(\kappa_6^{(2)})^2 u_1^{(3)}.$$

$$\left[\frac{\tilde{c}_{66,00}}{c_{66}}(\kappa_6^{(0)})^2 - \frac{\Omega^2}{3}(1+3R)\right]\left[\frac{9}{5}\frac{\tilde{c}_{66,22}}{c_{66}}(\kappa_6^{(2)})^2 - \frac{\Omega^2}{7}(1+7R)\right] = \quad (52)$$
$$\left[\frac{\tilde{c}_{66,20}}{c_{66}}\kappa_6^{(0)}\kappa_6^{(2)} - \frac{\Omega^2}{5}(1+5R)\right]^2.$$

(53)

| Mass ratio $R$ | $\kappa_6^{(0)}$ | $\kappa_6^{(2)}$ |
|----------------|------------------|------------------|
| 0.00000000 | 0.94763989 | 0.76229492 |
| 0.00792752 | 0.94976523 | 0.77084812 |
| 0.01585504 | 0.95152430 | 0.77792868 |
| 0.02378256 | 0.95296926 | 0.78373859 |
| 0.03171008 | 0.95414294 | 0.78844825 |
| 0.03963760 | 0.95508110 | 0.79220272 |
| 0.04756512 | 0.95581346 | 0.79512584 |
| 0.05549264 | 0.95636545 | 0.79732442 |
| 0.06342016 | 0.95675852 | 0.79889050 |
| 0.07134768 | 0.95701118 | 0.79990387 |
| 0.07927520 | 0.95713913 | 0.80043386 |
| 0.08720272 | 0.95715634 | 0.80054090 |
| 0.09513024 | 0.95707436 | 0.80027755 |
| 0.10305776 | 0.95690394 | 0.79969009 |
| 0.11098528 | 0.95665407 | 0.79881887 |
| 0.11891280 | 0.95633273 | 0.79769935 |

Let $\alpha = \kappa_2^{(0)}$, $\beta = \kappa_4^{(0)}$, $\gamma = \kappa_2^{(2)}$, and $\delta = \kappa_4^{(2)}$. For the coupled thickness-stretch and width-shear vibrations we have $$T_2^{(0)} = 2b\tilde{c}_{22,00}\alpha^2 u_2^{(1)} + 2b\tilde{c}_{24,00}\alpha\beta u_3^{(1)} + \quad (54)$$
$$\qquad 2b^3\tilde{c}_{22,02}\alpha\gamma u_2^{(3)} + 2b^3\tilde{c}_{24,02}\alpha\delta u_3^{(3)},$$

$$T_4^{(0)} = 2b\tilde{c}_{42,00}\alpha\beta u_2^{(1)} + 2b\tilde{c}_{44,00}\beta^2 u_3^{(1)} +$$
$$\qquad 2b^3\tilde{c}_{42,02}\beta\gamma u_2^{(3)} + 2b^3\tilde{c}_{44,02}\beta\delta u_3^{(3)},$$

$$T_2^{(2)} = \frac{2b^3}{3}\tilde{c}_{22,20}\alpha\gamma u_2^{(1)} + \frac{2b^3}{3}\beta\gamma\tilde{c}_{24,20}u_3^{(1)} +$$
$$\qquad \frac{6b^5}{5}\gamma^2\tilde{c}_{22,22}u_2^{(3)} + \frac{6b^5}{5}3\tilde{c}_{24,22}\gamma\delta u_3^{(3)},$$

(49)

| $b'/b$ | Mass ratio $R$ | 1st root | 2nd root | 3rd root | 4th root |
|--------|----------------|----------|----------|----------|----------|
| 0.000 | 0.00000000 | 1.80380664 | 3.32679794 | 5.41141992 | 9.01903320 |
| 0.001 | 0.00792752 | 1.78961996 | 3.30063318 | 5.36887326 | 8.94816666 |
| 0.010 | 0.07927520 | 1.67173520 | 3.08324315 | 5.02481984 | 8.40280470 |

-continued $$T_4^{(2)} = \frac{2b^3}{3}\alpha\delta\tilde{c}_{42,20}u_2^{(1)} + \frac{2b^3}{3}\tilde{c}_{44,20}\beta\delta u_3^{(1)} + \frac{6b^5}{5}\tilde{c}_{42,22}\gamma\delta u_2^{(3)} + \frac{6b^5}{5}3\tilde{c}_{44,22}\delta^2 u_3^{(3)}.$$  (5)

$$\left(\alpha^2 \tilde{c}_{22,00} - \frac{\Omega^2}{3}R_3\right)A_2^{(1)} + \alpha\beta\tilde{c}_{24,00}A_3^{(1)} +$$  (55)

$$\left(\alpha\gamma\tilde{c}_{22,02} - \frac{\Omega^2}{5}R_5\right)A_2^{(3)} + \alpha\delta\tilde{c}_{24,02}A_3^{(3)} = 0,$$

$$\alpha\beta\tilde{c}_{42,00}A_2^{(1)} + \left(\beta^2\tilde{c}_{44,00} - \frac{\Omega^2}{3}R_3\right)A_3^{(1)} +$$

$$\beta\gamma\tilde{c}_{42,02}A_2^{(3)} + \left(\beta\delta\tilde{c}_{44,02} - \frac{\Omega^2}{5}R_5\right)A_3^{(3)} = 0,$$

$$\left(\alpha\gamma\tilde{c}_{22,20} - \frac{\Omega^2}{5}R_5\right)A_2^{(1)} + \beta\gamma\tilde{c}_{24,20}A_3^{(1)} +$$

$$\left(\frac{9}{5}\gamma^2\tilde{c}_{22,22} - \frac{\Omega^2}{7}R_7\right)A_2^{(3)} + \frac{9}{5}\gamma\delta\tilde{c}_{22,22}A_3^{(3)} = 0,$$

$$\alpha\delta\tilde{c}_{42,20}A_2^{(1)} + \left(\beta\delta\tilde{c}_{44,20} - \frac{\Omega^2}{5}R_5\right)A_3^{(1)} +$$

$$\frac{9}{5}\gamma\delta\tilde{c}_{42,22}A_2^{(3)} + \left(\frac{9}{5}\delta^2\tilde{c}_{44,22} - \frac{\Omega^2}{7}R_7\right)A_3^{(3)} = 0,$$

$$\tilde{c}_{pq,mn} = \frac{\tilde{c}_{pq,mn}}{c_{66}}, \quad p,q = 2,4, \quad R_j = 1 + jR, \quad j = 1,3,5,7.$$

| Mass ratio R | $\kappa_2^{(0)}$ | $\kappa_2^{(2)}$ | $\kappa_4^{(0)}$ | $\kappa_4^{(2)}$ |
|---|---|---|---|---|
| 0.00000000 | 0.94763989 | 0.76229492 | 0.94763989 | 0.76229492 |
| 0.00792752 | 0.92512796 | 0.75142068 | 0.94799633 | 0.77047659 |
| 0.01585504 | 0.90407543 | 0.74084139 | 0.94802166 | 0.77718012 |
| 0.02378256 | 0.88456013 | 0.73114115 | 0.94777284 | 0.78262028 |
| 0.03171008 | 0.86654397 | 0.72251007 | 0.94729675 | 0.78697897 |
| 0.03963760 | 0.84993078 | 0.71492877 | 0.94663213 | 0.79041086 |
| 0.04756512 | 0.83459874 | 0.70828794 | 0.94581125 | 0.79304781 |
| 0.05549264 | 0.82042779 | 0.70245216 | 0.94486096 | 0.79500234 |
| 0.06342016 | 0.80730119 | 0.69729098 | 0.94380376 | 0.79637055 |
| 0.07134768 | 0.79511279 | 0.69268751 | 0.94265837 | 0.79723464 |
| 0.07927520 | 0.78376756 | 0.68854298 | 0.94144058 | 0.79766460 |
| 0.08720272 | 0.77318124 | 0.68477551 | 0.94016366 | 0.79772089 |
| 0.09513024 | 0.76327662 | 0.68131760 | 0.93883875 | 0.79745497 |
| 0.10305776 | 0.75399121 | 0.67811518 | 0.93747518 | 0.79691111 |
| 0.11098528 | 0.74526560 | 0.67512361 | 0.93608088 | 0.79612735 |
| 0.11891280 | 0.73704846 | 0.67230679 | 0.93466255 | 0.79513645 |

(56)

What is claimed:

1. A method for verifying a design of an electroded crystal plate, comprising:

forming a model of the electroded crystal plate that considers stress and strain characteristics of the electroded crystal plate, wherein the forming of the model includes developing correction factors for a third- or higher-order power-series-based plate theory, wherein the developed correction factors include correction factors for zeroth to nth-order stress-strain relations, where n is an integer greater than or equal to 3 and represents the order of the power-series-based plate theory; and analyzing the model of the electroded crystal plate with the at least one developed correction factor to determine at least one vibration frequency characteristic of the electroded crystal plate to determine whether the electroded crystal plate meets a design specification.

2. The method of claim 1, wherein the at least one vibration frequency characteristic includes a fundamental thickness-shear frequency of the electroded crystal plate.

3. The method of claim 1, wherein the at least one vibration frequency characteristic includes coupling characteristics between a thickness-shear vibration mode of the electroded crystal plate and at least one other vibration mode of the electroded crystal plate.

4. The method of claim 1, wherein the at least one vibration frequency characteristic includes coupling characteristics between a thickness-stretch vibration mode and at least one other vibration mode of the electroded crystal plate.

5. The method of claim 3, wherein the at least one other vibration mode includes a flexural vibration mode.

6. The method of claim 1, wherein the crystal plate is made of AT-cut quartz crystal.

7. The method of claim 1, wherein the at least one correction factor is developed by forming a stress-strain model of the electroded crystal plate.

8. The method of claim 7, wherein the at least one correction factor is developed by further forming a motion model of the electroded crystal plate based on the stress-strain model of the electrode crystal plate.

9. The method of claim 8, wherein the at least one correction factor is developed by forming a frequency model of the electroded crystal plate based on the stress-strain model and the motion model of the electroded crystal plate.

10. An apparatus for verifying a design of an electroded crystal plate, comprising:

means for forming a model of the electroded crystal plate that considers stress and strain characteristics of the electroded crystal plate, wherein the forming of the model includes developing correction factors for a third- or higher-order power-series-based plate theory, wherein the developed correction factors include correction factors for zeroth to nth-order stress-strain relations, where n is an integer greater than or equal to 3 and represents the order of the power-series-based plate theory; and means for analyzing the model of the electroded crystal plate with the at least one developed correction factor to determine at least one vibration frequency characteristic of the electroded crystal plate to determine whether the electroded crystal plate meets a design specification.

11. The apparatus of claim 10, wherein determining at least one vibration frequency characteristic includes determining a fundamental thickness-shear frequency of the electroded crystal plate.

12. The apparatus of claim 10, wherein determining at least one vibration frequency characteristic includes determining coupling characteristics between a thickness-shear vibration mode of the electroded crystal plate and at least one other vibration mode of the electroded crystal plate.

13. The apparatus of claim 10, wherein determining at least one vibration frequency characteristic includes determining coupling characteristics between a thickness-stretch vibration mode of the electroded crystal plate and at least one other vibration mode of the electroded crystal plate.

14. The apparatus of claim 12, wherein the at least one other vibration mode includes a flexural vibration mode.

15. The apparatus of claim 10, wherein the electroded crystal plate is made of AT-cut quartz crystal.

16. The apparatus of claim 10, wherein the at least one correction factor is developed by forming a stress-strain model of the electroded crystal plate.

17. The apparatus of claim 16, wherein the at least one correction factor is developed by further forming a motion model of the electroded crystal plate based on the stress-strain model of the electroded crystal plate.

18. The apparatus of claim 17, wherein the at least one correction factor is developed by forming a frequency model of the electroded crystal plate based on the stress-strain model and the motion model of the electroded crystal plate.

19. A processor-readable medium embodying a program of instructions for execution by the processor to perform a method for verifying a design of an electroded crystal plate, said program of instructions comprising instructions for:

forming a model of the electroded crystal plate that considers stress and strain characteristics of the electroded crystal plate, wherein the forming of the model includes developing correction factors for a third- or higher-order power-series-based plate theory, wherein the developed correction factors include correction factors for zeroth to nth-order stress-strain relations, where n is an integer greater than or equal to 3 and represents the order of the power-series-based plate theory; and analyzing the model of the electroded crystal plate with the at least one developed correction factor to determine at least one vibration frequency characteristic of the electroded crystal plate to determine whether the electroded crystal plate meets a design specification.

20. The processor-readable medium of claim 19, wherein the at least on vibration frequency characteristic includes a fundamental thickness-shear frequency of the electroded crystal plate.

21. The processor-readable medium of claim 19, wherein the at least one vibration frequency characteristic includes coupling characteristics between a thickness-shear vibration mode of the electroded crystal plate and at least one other vibration mode of the electroded crystal plate.

22. The processor-readable medium of claim 19, wherein the at least on vibration frequency characteristic includes coupling characteristics between a thickness-stretch vibration mode and at least one other vibration mode of the electroded crystal plate.

23. The processor-readable medium of claim 21, wherein the at least one other vibration mode includes a flexural vibration mode.

24. The processor-readable medium of claim 19, wherein the crystal plate is made of AT-cut quartz crystal.

25. The processor-readable medium of claim 19, wherein the at least one correction factor is developed by forming a stress-strain model of the electroded crystal plate.

26. The processor-readable medium of claim 25, wherein the at least one correction factor is developed by further forming a motion model of the electroded crystal plate based on the stress-strain model of the electrode crystal plate.

27. The processor-readable medium of claim 26, wherein the at least one correction factor is developed by forming a frequency model of the electroded crystal plate based on the stress-strain model and the motion model of the electroded crystal plate.

28. A piezoelectric device, comprising:

a piezoelectric plate; and at least one electrode affixed to the piezoelectric plate;

wherein a model of the electroded piezoelectric plate, including the development of correction factors for a third- or higher-order power-series-based plate theory, is formed and analyzed with the developed correction factors during a design of the piezoelectric device to determine at least one vibration frequency characteristic of the electroded piezoelectric plate to determine whether the electroded piezoelectric plate meets a design specification to reduce requirements for post-production processing of the piezoelectric device, wherein the model considers stress and strain characteristics of the electroded crystal plate, and wherein the developed correction factors include correction factors for zeroth to nth-order stress-strain relations, where n is an integer greater than or equal to 3 and represents the order of the power-series-based plate theory.

* * * * *

UNITED STATES PATENT AND TRADEMARK OFFICE
CERTIFICATE OF CORRECTION

PATENT NO.    : 6,658,376 B1
DATED         : December 2, 2003
INVENTOR(S)   : Ji Wang et al.

It is certified that error appears in the above-identified patent and that said Letters Patent is hereby corrected as shown below:

Column 20,
Line 13, change "at least on" to -- at least one --

Signed and Sealed this

Twenty-second Day of June, 2004

JON W. DUDAS
*Acting Director of the United States Patent and Trademark Office*